(12) United States Patent
Beausoleil et al.

(10) Patent No.: US 6,850,880 B1
(45) Date of Patent: Feb. 1, 2005

(54) HIGH SPEED SOFTWARE DRIVEN EMULATOR COMPRISED OF A PLURALITY OF EMULATION PROCESSORS WITH AN IMPROVED MAINTENANCE BUS THAT STREAMS DATA AT HIGH SPEED

(75) Inventors: William F. Beausoleil, Hopewell Junction, NY (US); R. Bryan Cook, Poughkeepsie, NY (US); Tak-kwong Ng, Hyde Park, NY (US); Helmut Roth, Hopewell Junction, NY (US); Peter Tannenbaum, Woodstock, NY (US); Lawrence A. Thomas, West Hurley, NY (US); Norton J. Tomassetti, Kingston, NY (US)

(73) Assignee: Quickturn Design Systems, Inc., San Jose, CA (US)

( * ) Notice: Subject to any disclaimer, the term of this patent is extended or adjusted under 35 U.S.C. 154(b) by 886 days.

(21) Appl. No.: 09/656,147

(22) Filed: Sep. 6, 2000

(51) Int. Cl.$^7$ .............................................. G06F 9/455
(52) U.S. Cl. ........................................... 703/23; 703/26
(58) Field of Search ..................................... 703/23, 26

(56) References Cited

U.S. PATENT DOCUMENTS

| 4,087,794 | A | * | 5/1978 | Beausoleil et al. ........... 703/24 |
| 5,202,976 | A | * | 4/1993 | Hansen et al. ................ 703/28 |
| 5,551,013 | A |   | 8/1996 | Beausoleil et al. ........... 703/23 |

* cited by examiner

*Primary Examiner*—Hugh Jones
(74) *Attorney, Agent, or Firm*—Orrick Herrington & Sutcliffe LLP

(57) ABSTRACT

A software driven emulator has a maintenance bus operating protocol mode in which, after an initial address phase, data is streamed continuously by automatically incrementing the sending and receiving addresses.

7 Claims, 2 Drawing Sheets

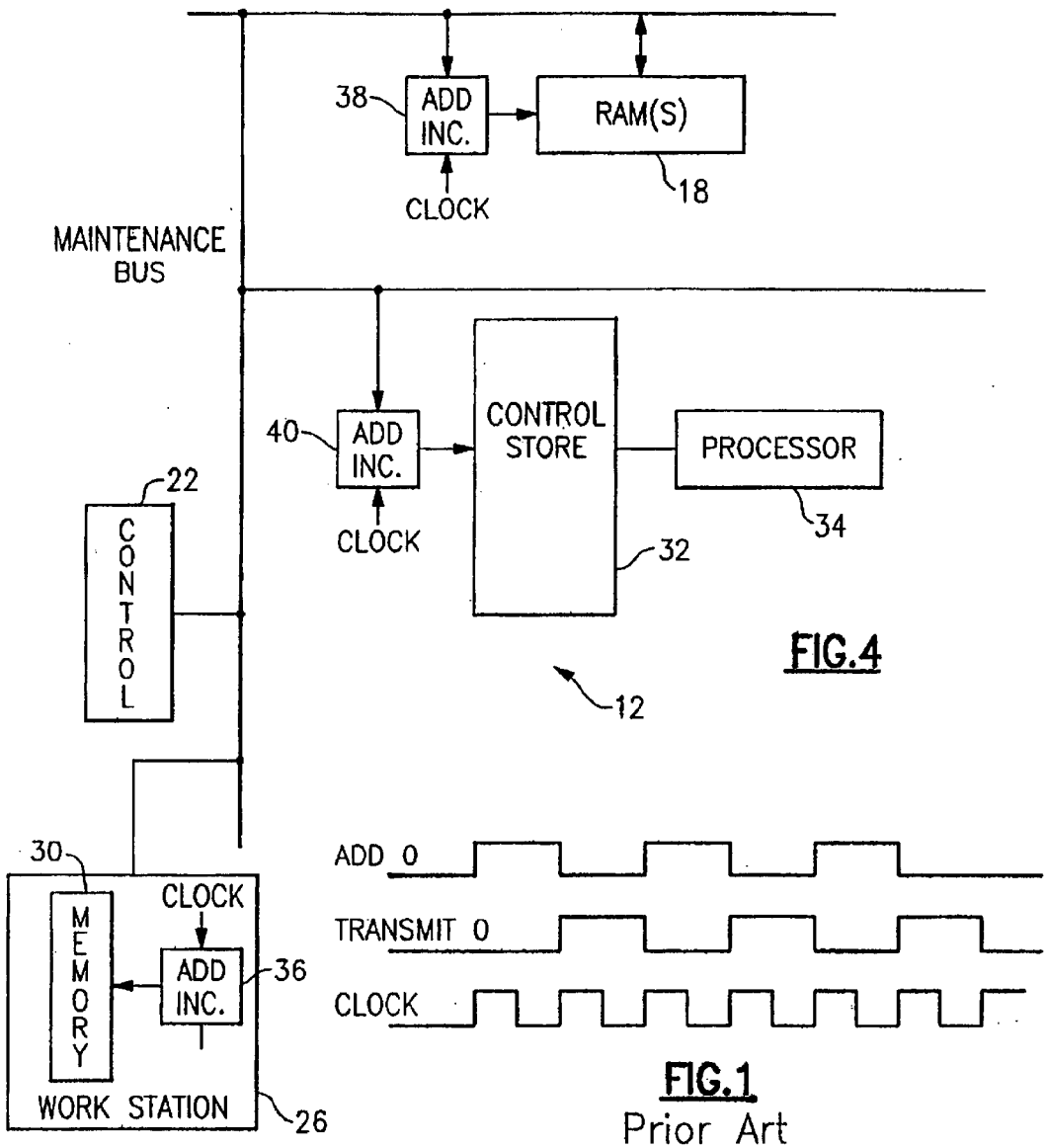
FIG.4
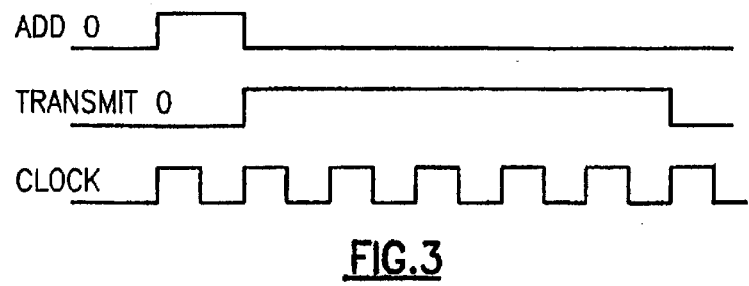
FIG.1
Prior Art
FIG.3

HIGH SPEED SOFTWARE DRIVEN EMULATOR COMPRISED OF A PLURALITY OF EMULATION PROCESSORS WITH AN IMPROVED MAINTENANCE BUS THAT STREAMS DATA AT HIGH SPEED

CROSS REFERENCE TO RELATED APPLICATIONS

The following copending applications, assigned to the assignee of the present invention, contain common disclosure and are incorporated herein by reference in their entireties: "High Speed Software Driven Emulator Comprised of a Plurality of Emulation Processors with Improved Board-to-Board Interconnection Cable Length Identification System," Ser. No. 09/655,595 filed Sep. 6, 2000.

"High Speed Software Driven Emulator Comprised of a Plurality of Emulation Processors with a Method to Allow High Speed Bulk Read/Write Operation Synchronous DRAM While Refreshing the Memory," Ser. No. 09/565,541 filed Sep. 6, 2000.

"High Speed Software Driven Emulator Comprised of a Plurality of Emulation Processors with a Method to Allow Memory Read/Writes Without Interrupting the Emulation," Ser. No. 09/665,596, filed Sep. 6, 2000.

"High Speed Software Driven Emulator Comprised of a Plurality of Emulation Processors with Improved Multiplexed Data Memory," Ser. No. 09/656,146, filed Sep. 6, 2000.

TRADEMARKS

S/390 and IBM are registered trademarks of International Business Machines Corporation, Armonk, N.Y., U.S.A. and Lotus is a registered trademark of its subsidiary Lotus Development Corporation, an independent subsidiary of International Business Machines Corporation, Armonk, N.Y. Other names may be registered trademarks or product names of International Business Machines Corporation or other companies.

FIELD OF THE INVENTION

This invention relates to a software drive emulator comprised of a large number of processors operated in parallel to emulate complex logical functions, and more particularly, to an improved, high speed, streaming data bus.

BACKGROUND

The usefulness of software driven emulators has increased enormously with growth in the complexity of integrated circuits. Basically, an emulation engine operates to mimic the logical design of a set of one or more integrated circuit chips. The emulation of these chips in terms of their logical design is highly desirable for several reasons. The utilization of emulation engines has also grown up with and around the corresponding utilization of design automation tools for the construction and design of integrated circuit chip devices. In particular, as part of the input for the design automation process, logic descriptions of the desired circuit chip functions are provided. The existence of such software tools for processing these descriptions in the design process is well suited to the utilization of emulation engines which are electrically configured to duplicate the same logic function that is provided by a design automation tool.

Utilization of emulation devices permits testing and verification via electrical circuits of logic designs before these designs are committed to a socalled "silicon foundry" for manufacture. The input to such foundries is the functional logic description required for the chip and its output is initially a set of photolithographic masks which are then used in the manufacture of the desired electrical circuit chip device. Verifying that logic designs are correct in the early stage of chip manufacturing eliminates the need for costly and timeconsuming second passes through a silicon foundry.

Another advantage of emulation systems is that they provide a device that makes possible the early validation of software meant to operate the emulated chips. Thus, software can be designed, evaluated and tested well before the time when actual circuit chips become available. Additionally, emulation systems can also operate as simulatoraccelerator devices thus providing a highspeed simulation platform.

Emulation engines of the type contemplated by this invention contain an interconnected array of emulation processors (EP) Each emulation processor (hereinafter, also sometimes simply referred to as "processor") can be programmed to evaluate logic function (for example, AND, OR, XOR, NOT, NOR, NAND, etc.). The program driven processors operate together as an interconnected unit, emulate the entire desired logic design. However, as integrated circuit designs grow in size, more emulation processors are required to accomplish the emulation task. An aim, therefore, is to increase the capacity of emulation engines in order to meet the increasingly difficult task of emulating more and more complex circuits and logic functions by increasing the number of emulation processors in each of its modules.

For purposes of better understanding the structure and operation of emulation devices generally, and this invention particularly, U.S. Pat. No. 5,551,013 and patent application Ser. No. 09/373,125 filed Aug. 12, 1999 and assigned to the assignee of this application are hereby incorporated herein by reference.

U.S. Pat. No. 5,551,013 shows a module having multiple (e.g. 64) processors. All processors within the module are the same. The sequencer and the interconnection network occurs only once in a module. The control stores hold a program created by an emulation compiler for a specified processor. The stacks hold data and inputs previously generated and are addressed by fields in a corresponding control word to locate the bits for input to the logic element. During each step of the sequencer an emulation processor emulates a logic function according to the emulation program. The data flow control interprets the current control word to route and latch data within the processor. The node-bit-out signal from a specified processor is presented to the interconnection network where it is distributed to each of the multiplexers (one for each processor) of the module. The node address field in the control word allows a specified processor to select for its node-bit-in signal the node-bit-out signal from any of the processors within its module. The node bit is stored in the input stack on every step. During any operation the node-bit-out signal of a specified processor may be accessed by none, one, or all of the processors within the module.

Data routing within each processor's data flow and through the interconnection network occurs independently of and overlaps the execution of the logic emulation function in each processor. Each control store stores control words executed sequentially under control of the sequencer and program steps in the associated module. Each revolution of the sequencer causes the step value to advance from zero to a predetermined maximum value and corresponds to one target clock cycle for the emulated design. A control word in the control store is simultaneously selected during each step of the sequencer. A logic function operation is defined by each control word.

Each of these emulation processors has an execution unit for processing multiple types of logic gate functions. Each emulation processor switches from a specified one logic gate function to a next logic gate function in a switched-emulation sequence of different gate functions. The switched-emulation sequence of each of the processors thus can emulate a subset of gates in a hardware arrangement in which gates are of any type that the emulation processors functionally represent for a sequence of clock cycles. The processors are coupled by a like number of multiplexers having outputs respectively connected to the emulation processors of a module and having inputs respectively connected to each of the other emulation processors. The bus connected to the multiplexers enables an output from any emulation processor to be transferred to an input of any other of the emulation processors.

In prior art emulators, such as the ET3.5 and ET3.7, the system data bus, referred to as the maintenance bus, employs a handshaking protocol that includes an address phase a data phase (including an acknowledge) for each data transfer from or to a specific address, as illustrated in FIG. 1. For each transfer of data to or from a memory location, the address of the receiving location in transmitted in the address phase, followed by the transfer the data for that addressed location, a return a acknowledge or "done" signal. This handshake protocol is time consuming when transferring blocks of data to or from memories in the emulator over the maintenance bus.

SUMMARY OF THE INVENTION

An object of this invention is the provision of an emulator with a maintenance bus protocol that facilitates high-speed, high-volume, data transfer to and from emulator memories.

Briefly, this invention contemplates the provision of a software driven emulator that has a maintenance bus operating protocol mode in which, after an initial address phase, data is streamed continuously by automatically incrementing the sending and receiving addresses.

BRIEF DESCRIPTION OF THE DRAWINGS

The foregoing and other objects, aspects and advantages will be better understood from the following detailed description of a preferred embodiment of the invention, in which:

FIG. 1 is a simplified phase diagram of the prior art maintenance bus protocol.

FIG. 3 is a phase diagram similar to FIG. 1 showing the phase diagram for a maintenance bus in accordance with the teaching of this invention.

FIG. 4 is a block diagram illustrating the functional units involved in making a bulk transfer with the maintenance bus operating in accordance with the teachings of the invention.

DETAILED DESCRIPTION OF THE INVENTION

Figure 2:
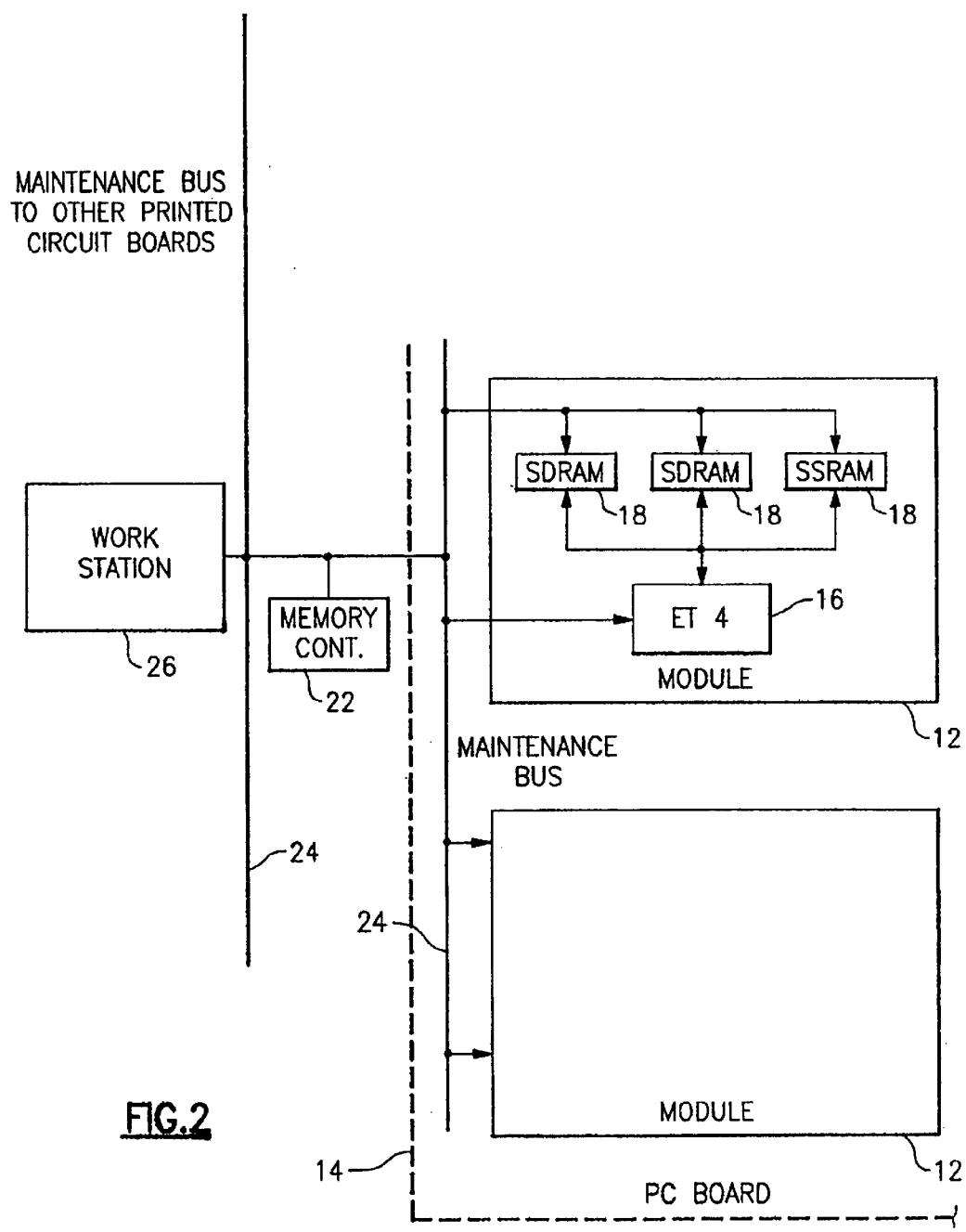
FIG. 2 is a high-level block diagram showing a fragment of an emulator PC printed circuit board with two of the 64 modules mounted on it and the maintenance bus that serves the modules on the board.

Referring now to FIG. 2 of the drawings, as explained more completely in U.S. Pat. No. 5,551,013 and copending application Ser. No. 09/373,125, an emulation engine of the type contemplated by this invention is comprised of a number of modules 12 (e.g., 64 modules) mounted on one of a number of printed circuit boards 14. Each module includes a processor chip 16 (referred to herein as an ET4 chip) and RAM memories 18; in a specific embodiment two commercially available SDRAMs and a SSRAM. The processor chip 16 is comprised of a large number (e.g. 256) of individual processors each with supporting memories, including a control store. A memory controller 22 for each print circuit board 14 provides memory interface and control functions to the modules on the board via the maintenance bus 24, which is also coupled to a work station 26 which serves the entire emulator.

Referring now to FIG. 3, in accordance with the teachings of this invention, after an initial address phase, data is transmitted as a continuous stream on each clock pulse via the maintenance bus between sending and receiving memory locations. At the sending and receiving location incrementing logic automatically increments the sending and receiving memory address on clock pulse, starting with the initial addresses.

Referring now also to FIG. 4, bulk transfers of data take place between a memory 30 in the work station and the RAM 18 in each module and the control store 32 associated with each processor 34 in a module 12.

Address incrementing logic 36 automatically increments on each clock pulse the address of the work station memory 30 in carrying out transfers between the work station memory 30 and the module RAM memories 18 and between work station memory 30 and the control stores 32 associated with each processor 34 of a module. Address logic 38 increments the address of RAM automatically on each clock when the transfer is between the work station and RAM 18. Similarly, address logic increments the address of control store 32 on each clock when the data transfer is between the work station and the control store.

In operation, in transferring data between work station memory 30 to a RAM memory 18 in the address phase, a starting address is input to work station address logic 36 and to RAM address logic 38 by means of a work station program input or a keyboard input, for example. At the end of this address phase, data is read from or to the work station memory 32 during the next clock cycle at the starting send address and via the maintenance bus to the RAM 18 at its starting address. The work station and RAM address are automatically incremented by the address logic 36 and 38 and another block of data is transferred on the next clock cycle from and to these incremented addresses. The process of increment and send is repeated at each subsequent clock cycle until the bulk transfer is complete. Obviously, the same steps are used in the bulk transfer of data between the work station and the control store.

As will be appreciated, data transfers involving an SDRAM must make an allowance for the periodic SDRAM refresh cycle. This can be accomplished by use of a periodic pause as taught in copending application entitled, Ser. No. 09/373,125.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. In an emulation engine comprised of a plurality of modules, a work station, and a maintenance bus for transferring data between the work station and said modules, each of said modules including a plurality of module processors and a module main memory unit accessible for data transfers during an emulation by each of said plurality of processors, each of said processors having a control store to store a programmable sequence of emulation steps that define logic states for its processor, a method to allow data transfers between said module main memory unit and said work station without interrupting an in progress emulation, including the steps of:

transferring an initial module memory address to said module memory from said work station;

establishing an initial work station memory address;

automatically incrementing at said module memory said module memory address;

automatically incrementing at said work station said work station memory address;

streaming data between said module memory and said work station at said incremented address.

2. A method to allow data transfers between said module main memory unit and said workstation without interrupting an in-progress emulation as in claim 1 wherein said streaming data steps transfers a block of data with each clock pulse.

3. A method to allow data transfers between said module main memory unit and said workstation without interrupting an in-progress emulation as in claim 1 wherein said automatically incrementing at said module memory said module memory address step step increments said module memory address with each clock pulse.

4. A method to allow data transfers between said module main memory unit and said workstation without interrupting an in-progress emulation as in claim 1 wherein said automatically incrementing at said workstation said workstation memory address step increments said workstation memory address with each clock pulse.

5. A method to allow data transfers between said module main memory unit and said workstation without interrupting an in-progress emulation as in claim 2 wherein said automatically incrementing at said module memory said module memory address step step increments said module memory address with each clock pulse.

6. A method to allow data transfers between said module main memory unit and said workstation without interrupting an in-progress emulation as in claim 2 wherein said automatically incrementing at said workstation said workstation memory address step increments said workstation memory address with each clock pulse.

7. A method to allow data transfers between said module main memory unit and said workstation without interrupting an in-progress emulation as in claim 5 wherein said automatically incrementing at said workstation said workstation memory address step increments said workstation memory address with each clock pulse.

\* \* \* \* \*